United States Patent
El-Wardany et al.

(10) Patent No.: US 11,091,831 B1
(45) Date of Patent: Aug. 17, 2021

(54) PULSED DIRECTED ENERGY DEPOSITION BASED FABRICATION OF HYBRID TITANIUM/ALUMINUM MATERIAL FOR ENHANCED CORROSION RESISTANCE AND STRENGTH

(71) Applicant: Hamilton Sundstrand Corporation, Charlotte, NC (US)

(72) Inventors: Tahany Ibrahim El-Wardany, Vernon, CT (US); Ranadip Acharya, Rocky Hill, CT (US); Colette Opsahl Fennessy, West Hartford, CT (US); Matthew Pess, West Hartford, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/781,551

(22) Filed: Feb. 4, 2020

(51) Int. Cl.
| | |
|---|---|
| *C23C 14/16* | (2006.01) |
| *B23K 15/00* | (2006.01) |
| *C23C 14/02* | (2006.01) |
| *C23C 14/28* | (2006.01) |

(52) U.S. Cl.
CPC .......... *C23C 14/16* (2013.01); *B23K 15/0086* (2013.01); *C23C 14/025* (2013.01); *C23C 14/28* (2013.01); *Y10T 428/12736* (2015.01)

(58) Field of Classification Search
None
See application file for complete search history.

(56) References Cited

U.S. PATENT DOCUMENTS

| | | | |
|---|---|---|---|
| 5,352,538 | A | 10/1994 | Takeda et al. |
| 2013/0340815 | A1 | 12/2013 | Kim et al. |
| 2014/0202595 | A1 | 7/2014 | Hofmann |
| 2019/0054533 | A1 | 2/2019 | Kenney et al. |
| 2020/0376809 | A1 * | 12/2020 | Vogli .............. B23K 26/0006 |

FOREIGN PATENT DOCUMENTS

| | | |
|---|---|---|
| CN | 108568523 A | 9/1980 |
| CN | 104651830 A | 5/2015 |
| CN | 107177843 A | 9/2017 |
| CN | 106011847 B | 2/2019 |
| EP | 0213498 A2 | 3/1987 |

OTHER PUBLICATIONS

D.C. Hofmann et al., "Development of tough, low-density titanium-based bulk metallic glass matrix composites with tensile ductility" from PNAS vol. 105 No. 51, Dec. 23, 2008.

Somayeh Abdi, Dissertation, "Investigation of new Ti-based metallic glasses with improved mechanical properties and corrosion resistance for implant applications", 125 pages, Sep. 6, 1980.

Extended European Search Report for EP Application No. 21155157.7, dated Mar. 24, 2021, 7 pages.

* cited by examiner

*Primary Examiner* — Daniel J. Schleis
(74) *Attorney, Agent, or Firm* — Kinney & Lange, P.A.

(57) ABSTRACT

A method of providing a protective titanium layer to an outer surface of an aluminum component includes providing an aluminum component and forming a first layer of titanium-based bulk metallic glass on the component, wherein formation of the bulk metallic glass layer comprises depositing a titanium alloy powder using pulsed directed energy deposition.

8 Claims, 3 Drawing Sheets

PULSED DIRECTED ENERGY DEPOSITION BASED FABRICATION OF HYBRID TITANIUM/ALUMINUM MATERIAL FOR ENHANCED CORROSION RESISTANCE AND STRENGTH

BACKGROUND

The present application is directed generally to the fabrication of hybrid titanium/aluminum components and more particularly to a method and material for providing enhanced corrosion resistance and strength to an aluminum component.

Titanium alloys have been applied to aluminum components, particularly the leading edges of a fan blades, to enhance strength and provide protection from erosion. Current methods of manufacture of titanium external elements and assembly are complicated. Because titanium and aluminum are galvanically incompatible, the two materials generally must be separated by an insulating layer to limit corrosion. The fabrication of a titanium sheath on a hollow aluminum fan blade requires a multi-axis machining process. Application of the sheath can cause distortion of the blade and post processing can be required to remove defects. The current processes can be material- and time-intensive.

A need exists for an improved method of providing a titanium protective layer to an aluminum component.

SUMMARY

In one aspect, a method of providing a protective titanium layer to an outer surface of an aluminum component includes providing an aluminum component and forming a first layer of titanium-based bulk metallic glass on the component, wherein formation of the bulk metallic glass layer comprises depositing a titanium alloy powder using pulsed directed energy deposition.

In another aspect, an aluminum component includes an outer surface and a sheath covering at least a portion of the outer surface, wherein the sheath comprises a titanium-based bulk metallic glass layer characterized by a predominantly amorphous microstructure.

In yet another aspect, a method of providing a protective titanium layer to an aluminum component includes depositing a titanium alloy powder on an outer surface of the aluminum component, pulsing energy directly to the titanium alloy powder, melting the titanium alloy powder, and forming a first layer of titanium-based bulk metallic glass on the component.

The present summary is provided only by way of example, and not limitation. Other aspects of the present disclosure will be appreciated in view of the entirety of the present disclosure, including the entire text, claims, and accompanying figures.

Figure 1:
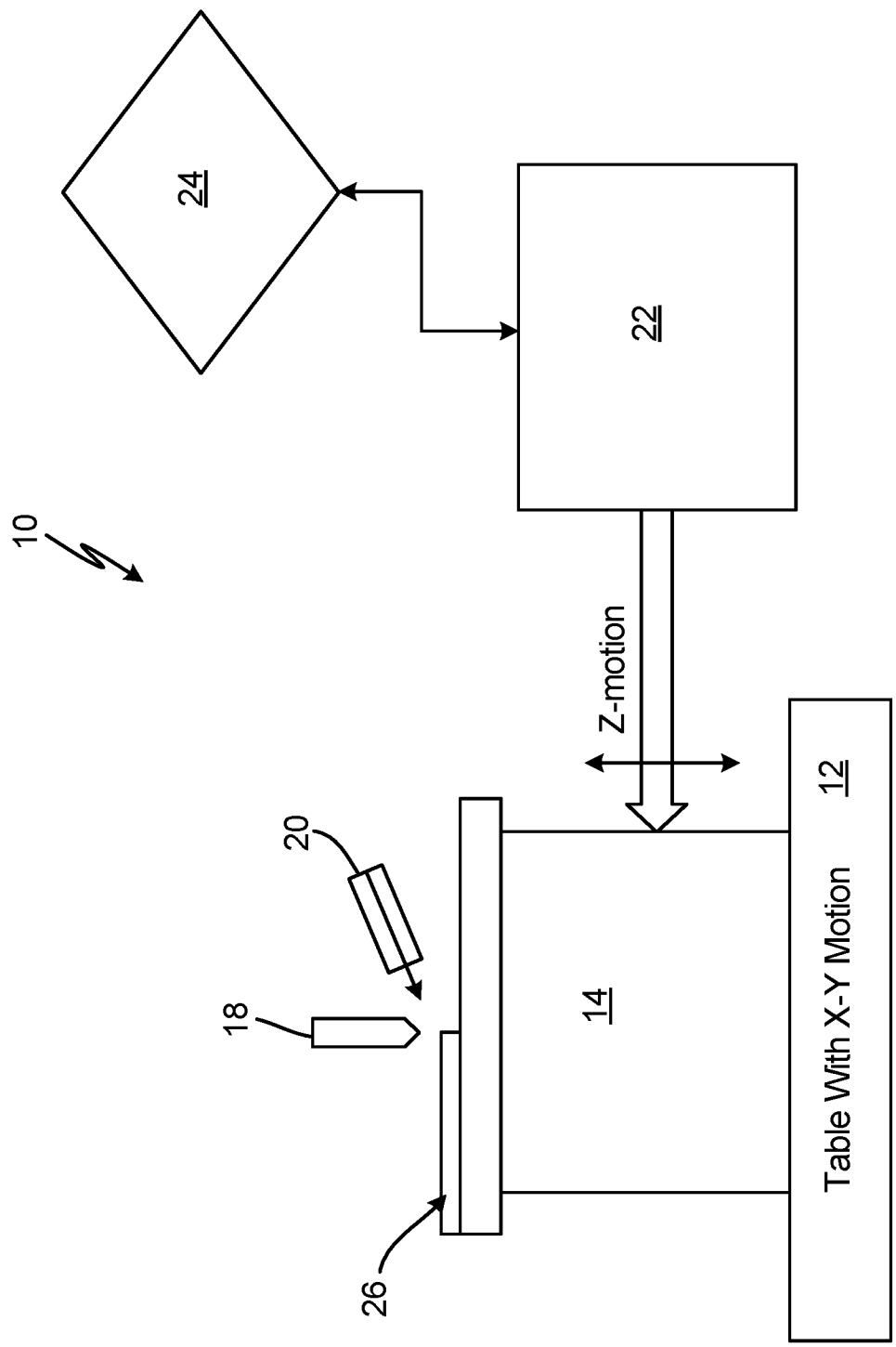
FIG. 1 is an assembly for providing a protective titanium layer to an aluminum component.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

The present disclosure provides an improved method of manufacture of a hybrid titanium/aluminum component. Using directed energy deposition (DED), a titanium alloy can be directly deposited onto an aluminum substrate. The disclosed process produces a titanium-based bulk metallic glass (BMG) having an amorphous microstructure, which has been shown to result in a 3-5 order of magnitude reduction in electrical conductivity over current titanium sheaths. Crystalline phases are introduced locally into the BMG by ultrasonic vibration. The introduction of crystalline phases has been shown to increase ductility of the titanium element. The disclosed BMG with selectively introduced crystalline phases can provide strength and protection to the component while reducing or eliminating the need for an insulating layer.

The disclosed method is not limited to the fabrication of a particular component. In addition to providing a titanium sheath on a portion of a blade (e.g., airfoil leading edge, root, etc.), the disclosed method can be applied for the fabrication of gears, heat exchanger parting sheets and headers, and titanium blades on an aluminum hub (e.g., hybrid material impellers), among a wide variety of other applications. It will be understood by one of ordinary skill in the art that the disclosed method could benefit multiple aluminum fabrication and assembly applications. Direct deposition of the titanium-based BMG can reduce the need for post-processing of aluminum components, including complex machining and application of an insulating layer, before assembly with a titanium element.

FIG. 1 illustrates a modified DED assembly 10 with ultrasonic vibration for providing a protective titanium layer to an aluminum component. DED is a metal additive manufacturing process in which metal powder is delivered to a substrate or workpiece as opposed to being provided in a powder bed. Metal powder is fed through a nozzle while an energy source (e.g., electron beam or laser) melts the powder to provide a melt pool, which is deposited on the component in a layer-by-layer fashion.

Assembly 10 includes a conventional DED system that has been modified to provide ultrasonic vibration to the substrate during deposition. Assembly 10 includes table 12, ultrasonic transducer 14, deposition platform 16, energy source 18, powder nozzle 20, power supply 22, and controller 24. Assembly 10 can be used to deposit thin layers of titanium-based BMG on substrate 26. Substrate 26 can be positioned and secured on deposition platform 16 in a manner that allows for material deposition on an outer surface of substrate 26. Table 12 can be configured as known in the art to be moveable in x-, y-, and z-planes to move substrate 26 relative to powder nozzle 20 and energy source 18 during deposition. In alternative embodiments, energy source 18 and powder nozzle 20 can be positioned on a multi-axis arm and can move relative to deposition platform 16 and substrate 26.

Power supply 22 can be used to drive ultrasonic transducer 14. Controller 24 can be used to automate the deposition of the titanium-based BMG on substrate 26 according to a user-defined deposition model. Controller 24 can turn ultrasonic transducer 14 on and off to provide localized production of crystalline phases in the deposited material and can also control movement of table 12 and other process parameters. Controller 24 can include a processor configured to implement and/or process instructions for execution stored in a storage device (e.g., computer-readable storage media).

Substrate 26 can be formed of aluminum or an aluminum alloy. Substrate 26 can be a net shape or near net shape component formed by casting, forging, additive manufacturing, or other fabrications processes as known in the art. In one embodiment disclosed herein, substrate 26 is a hollow aluminum fan blade (illustrated in FIG. 2). Substrate 26 is not limited to the embodiment disclosed. It will be understood by one of ordinary skill in the art that substrate 26 can be any aluminum component to which a titanium element may be applied to provide protection and strength to the underlying structure.

A titanium-based BMG powder (or titanium alloy capable of forming a BMG upon deposition with DED) can be deposited on substrate 26 using a conventional pulsed laser DED system. The powder size can generally be dictated by the operating capabilities of the machine. In the disclosed embodiment, the powder size ranged from 30 to 70 μm. The titanium-based BMG powder can be applied in multiple successive layers. Following formation of each layer, table 12 can be moved downward (z-direction) to maintain the focus of the laser at the surface. A single powder composition or multiple powder compositions can be fed through a single powder nozzle or multiple powder nozzles, as known in the art. Layer thickness can vary based on powder size and processing parameters. In one non-limiting embodiment, layer thickness was approximately 20 μm.

A variety of titanium alloys form a BMG upon pulsed laser deposition. Preferably, a titanium-based BMG powder used in the method disclosed has a melting temperature that does not exceed a melting temperature of the underlying substrate by more than 125 K. This allows for control of the depth of the titanium-based BMG melt pool interface with the outer surface of the aluminum substrate 26 during deposition of the first layer of the titanium sheath. In one non-limiting embodiment, the titanium-based BMG is $Ti_{40}Zr_{20}Cu_{10}Be_{30}$, which has a melting point of 1000 K (75 K higher than pure aluminum). By controlling the table speed and laser power, a very thin layer of interaction between the titanium-based BMG and aluminum can be formed.

Although rare, interaction between a melted layer of the aluminum substrate 26 and the titanium-based BMG may result in the undesirable production of an aluminide. To avoid aluminide formation, some embodiments may include the deposition of a layer of silver, magnesium, or other metal that does not interact with aluminum or titanium alloys, directly onto substrate 26 before deposition of the titanium-based BMG. The introduction of silver, magnesium, or other metal may additionally improve adhesion between the titanium-based BMG and substrate 26, although excellent adhesion between aluminum substrate 26 and the titanium-based BMG $Ti_{40}Zr_{20}Cu_{10}Be_{30}$ was observed with the disclosed process parameters. A powder of silver, magnesium, or other metal can be provided in the DED process as a single layer separate from the deposition of the titanium-based BMG and/or can be introduced with the titanium-based BMG in decreasing amounts in successive layers. The disclosed interlayer may not be necessary in all applications and, therefore, may be omitted from the disclosed method without negative impact. Generally, a high laser power and low travel speed can promote formation of an aluminide layer. It will be understood by one of ordinary skill in the art to provide the disclosed interlayer where the formation of aluminide is likely or to improve adhesion.

The titanium-based BMG can be applied using a standard pulsed laser as provided in a conventional DED system. The disclosed method was developed using a standard laser frequency of 36 kHz. It is anticipated that a much lower pulsed laser frequency could be applied and provide the same results. The pulsed laser, as opposed to continuous laser, promotes rapid cooling, which is necessary for the formation of the amorphous BMG.

The grain morphology of a particular material is influenced by the DED processing parameters. To promote amorphous or planar grain structures, the solidification rate must be kept relatively low and temperature gradient high. The solidification rate is generally reflected in the table speed in the x- and y-directions. The temperature gradient is inversely proportional to the power of the laser. As such, table motion speed and laser power can be selected to provide the rapid cooling necessary for formation of the amorphous structure. The predicted cooling rate required to fabricate an amorphous titanium-based BMG is $10^5$-$10^6$ K/s.

While the amorphous titanium-based BMG has been demonstrated to be galvanically compatible with an aluminum substrate, BMGs in general can be more brittle. To improve ductility of the titanium element, crystalline phases can be introduced into the titanium-based BMG. Crystalline phases are induced during the deposition process through the application of ultrasonic vibrations to substrate 26. Ultrasonic transducer 20 can be positioned under platform 14 upon which substrate 26 is secured. The ultrasonic vibrations provide more seeds which drive crystalline grain growth. The introduction of ultrasonic vibrations can thereby produce a hybrid microstructure including both crystalline and amorphous microstructures. Multiple crystalline phases can be introduced in a single layer and in multiple layers in varying amounts by turning ultrasonic transducer 20 on and off. Crystalline phases increase conductivity of the material and thereby can make the material more susceptible to corrosion. As such, it will be understood by one of ordinary skill in the art to limit the location of crystalline phases within the titanium element to regions where corrosion is less likely to occur.

In some embodiments, process parameters can be selected to promote crystalline growth. Process parameters can be selected to provide a higher solidification rate and lower temperature gradient than required for amorphous structure formation. For example, higher laser power and increased table speed can be used to promote crystalline growth. Process parameters can be modified to promote crystalline growth independent of or in conjunction with the addition of ultrasonic vibrations.

Controlling grain structure with processing parameters can require an accurate material model, whereas use of ultrasonic vibration is more heuristic in nature. An accurate thermal model of the material and experimental data is needed to calibrate a processing map through multiple process parameter variations and to obtain an accurate material model for crystalline-amorphous transition. In contrast, it is given that higher ultrasonic frequency than a threshold value (which can be determined from experiments) will induce more seeds and initiate crystalline transition.

In some embodiments, deep rolling, including ultrasonic deep rolling, as known in the art, can be introduced to further improve mechanical properties of the component. Deep rolling induces compressive stress to the component, which can further improve ductility and fracture properties. Deep rolling can be applied to each deposited layer of the titanium-based BMG or can be applied to select layers as needed to obtain the desired material properties for a particular application. In a non-limiting embodiment, ultrasonic deep rolling at a frequency not exceeding 50 kHz helped promote a desired ductility of at least 10% elongation.

Figure 2:
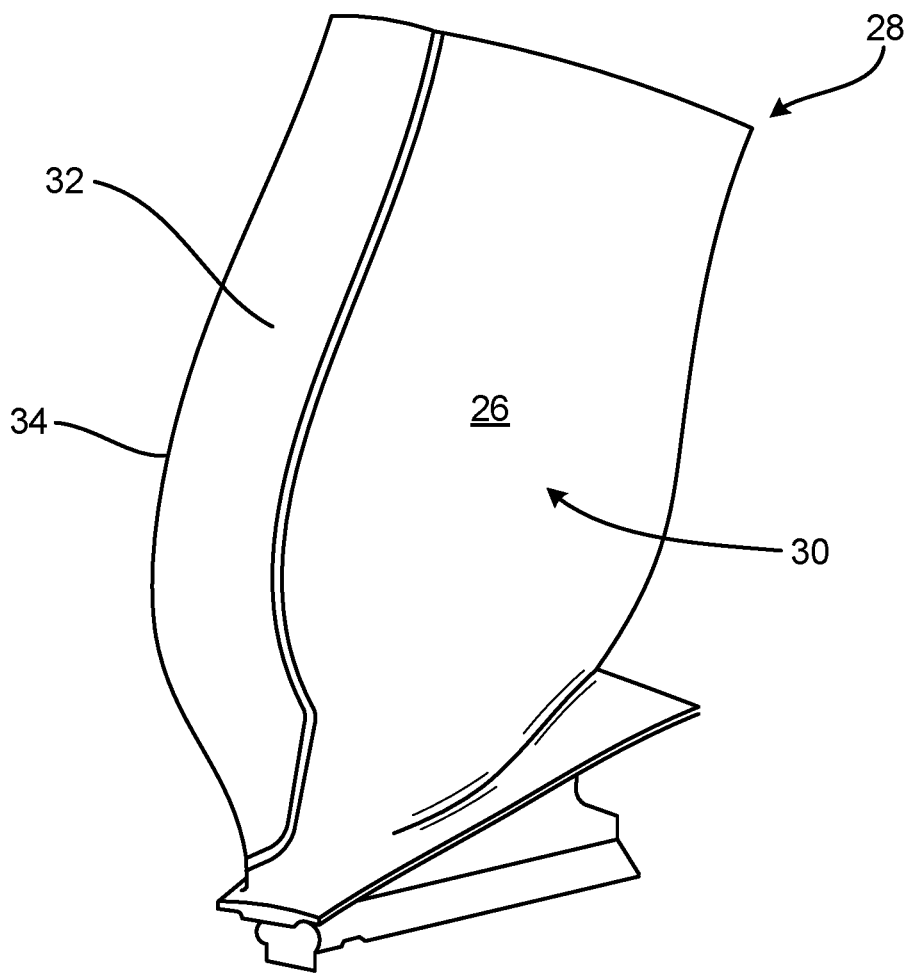
FIG. 2 is a perspective view of an aluminum fan blade of a gas turbine engine having a protective titanium sheath applied to a leading edge.

FIG. 2 is a perspective view of a fan blade of a gas turbine engine having a protective titanium sheath applied to a leading edge using the disclosed pulsed laser DED method with ultrasonic vibration. FIG. 2 illustrates fan blade 28. Fan blade 28 includes a hollow aluminum fan blade (substrate 26) with outer surface 30 and titanium sheath 32 applied at leading edge 34. Titanium sheath 32 is a multi-layer titanium-based BMG formed by pulsed laser DED with crystalline phases induced by ultrasonic vibrations in core layers to improve ductility. Titanium sheath 32 can be formed to any desired thickness. In the disclosed embodiments, the titanium sheath 32 can provide protection and strength to an underlying aluminum blade at least equivalent to a conventional titanium sheath of the same thickness.

Figure 3:
FIG. 3 is a cross-sectional view of one embodiment of the protective titanium sheath of FIG. 2.

FIG. 3 is a cross-sectional view of one embodiment of the protective titanium sheath of FIG. 2. FIG. 3 illustrates substrate 26, optional interlayer 36, predominantly amorphous titanium-based BMG layer 38, titanium-based BMG with crystalline phases layer 40, and predominantly amorphous titanium-based BMG outer layer 42. Each layer 36, 38, 40, and 42 can include a single material deposition layer or multiple layers of material deposition to achieve a desired thickness.

Interlayer 36 can optionally be applied directly to substrate 26 to provide an interface between the aluminum substrate and titanium-based BMG. Interlayer 36 can be magnesium, silver, or other metal that does not galvanically interact with aluminum and titanium. Interlayer 36 can limit the formation of undesirable aluminides during the DED process and may improve adhesion of titanium-based BMG layer 38. Interlayer 36 can be deposited as a single layer of pure material (e.g., magnesium) or can be deposited in multiple layers in combination with the titanium-based BMG layer 38, where the interlayer material is deposited in decreasing amounts in each successive layer. For example, BMG layer 38 can include a plurality of sub-layers (not labelled) in which interlayer material can be included in decreasing amounts from substrate 26 outward. Interlayer and titanium-based BMG powders can be deposited through separate powder nozzles or can be premixed and deposited through a single nozzle.

Titanium-based BMG layer 38 can include multiple layers of material deposition. Titanium-based BMG layer 38 is applied by pulsed laser DED with table speed and laser power selected to provide rapid cooling to promote BMG formation. Titanium-based BMG has a predominantly amorphous grain structure, which limits galvanic corrosion. In one non-limiting embodiment, titanium-based BMG can be $Ti_{40}Zr_{20}Cu_{10}Be_{30}$, which has a melting point of 1000 K (75 K higher than pure aluminum). By controlling the table speed and laser power, a very thin layer of interaction between the titanium-based BMG and aluminum can be formed. Other titanium-based BMGs are known in the art and may be suitable for application to aluminum. Selecting a titanium-based BMG having a melting point not exceeding 250 K greater than the aluminum or aluminum alloy can limit the thickness of the layer of interaction formed between the substrate and first layer of deposited material.

Titanium-based BMG layer 40 having crystalline phases is formed over titanium-based BMG layer 38. The crystalline phases are provided to increase ductility of the titanium sheath. In the non-limiting embodiment illustrated, sufficient crystalline phases are introduced to provide a ductility of at least 10 percent elongation. Layer 40 can include multiple layers of material deposition with similar or varying amounts and locations of crystalline phases formed in each layer.

Layer 40 can be formed by depositing the titanium-based BMG in a manner consistent with the deposition of titanium-based BMG for layer 38, but with the addition of ultrasonic vibration. Crystalline transition or grain refinement is induced by ultrasonic vibration provided by ultrasonic transducer 20 to substrate 26 during material deposition. Ultrasonic transducer 20 is turned on to induce crystalline phases into the microstructure and turned off to promote amorphous grain structure. In some embodiments, ultrasonic vibrations can be provided continuously (ultrasonic transducer 20 remains on) during material deposition of a layer. In alternative embodiments, ultrasonic vibrations can be applied intermittently to promote a hybrid microstructure including both amorphous and crystalline microstructures. Grain structure control and optimization can be provided by applying and removing ultrasonic vibration during the deposition process according to a programmed model of the microstructure.

In some embodiments, layer 40 can be formed by depositing the titanium-based BMG using process parameters that produce a higher solidification rate and/or lower temperature gradient than needed for amorphous structure formation, thereby, promoting crystalline growth. In some embodiments, both processing parameter selection and application of ultrasonic vibration can be used to induce crystalline microstructures.

Surface layers are prone to environmental degradation and hot corrosion. As such, it can be desirable to provide a second layer 42 of titanium-based BMG for the outermost portion of titanium sheath 32 thereby sandwiching crystalline layer 40 between two amorphous BMG layers 38 and 42. Titanium-based BMG layer 42 can be formed in a manner consistent with the formation of titanium-based BMG layer 38, as discussed above. The presence of crystalline layer 40 can provide sufficient ductility to titanium sheath 32.

Titanium-based BMG can provide a 3-5 order of magnitude reduction in electrical conductivity, thereby reducing the potential for corrosion, while also providing high strength to leading edge 34. The electrical conductivity for bulk metallic glass titanium alloys of interest is around $5.800 \times 10^2$ Siemens/m as compared to conventional non-bulk metallic glass titanium alloys, which have an electrical conductivity around $5.800 \times 10^5$ Siemens/m.

Figure 4:
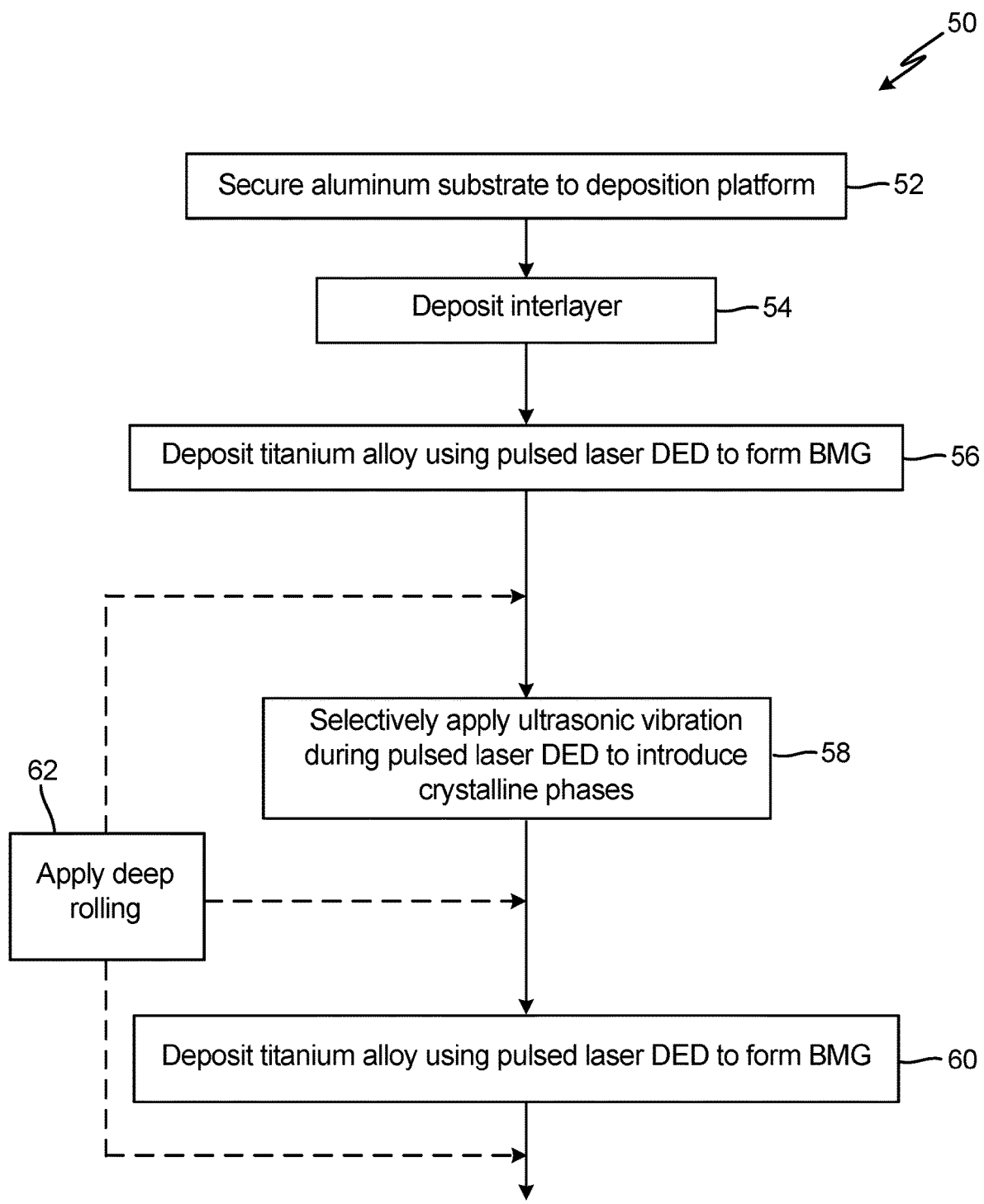
FIG. 4 is a flowchart of a method for forming a titanium element on an aluminum component.

FIG. 4 is a flowchart of method 50 for forming a titanium element on an aluminum component. An aluminum component in net shape or near net shape form is secured to a deposition platform in step 52. The aluminum component can be formed by any method known in the art, including but not limited to casting, forging, and additive manufacturing. The aluminum component can be formed of aluminum or an aluminum alloy. The aluminum component is not limited to a particular component disclosed herein but can include any component for which a titanium sheath or protective outer layer is applied.

An optional layer of magnesium, silver, or other metal compatible with both aluminum and titanium can be deposited on the aluminum substrate to limit the formation of aluminides and to promote adhesion between the aluminum component and a titanium-based BMG layer (step 54). The interlayer can be deposited in a single layer or multiple layers using DED. The interlayer can be formed of pure magnesium, silver, or similar metal or can be mixed with the titanium-based BMG in decreasing amounts in successive layers.

The titanium-based BMG layer is deposited on an outer surface of the aluminum component or the interlayer using a conventional pulsed laser DED system in which powder is supplied to the surface of a substrate in a focal beam of a laser and melted to form a BMG layer (step 56). A table moves the aluminum component in x- and y-directions to form a uniform layer over an entirety of an outer surface or specified regions. Processing parameters, including laser power and table motion can be selected to provide rapid cooling to promote formation of the amorphous BMG microstructure. With each layer, the table is moved downward to maintain laser beam focus on the outermost surface of the component.

The titanium-based BMG material can be selected based on mechanical properties and melting point. Deposition of a titanium-based BMG with a melting point not exceeding 125 K of the melting point of the aluminum substrate can limit a thickness of the region of interaction with the aluminum substrate during the deposition process. The titanium-based BMG layer can include multiple layers of deposited material.

Crystalline phases can be introduced in a subsequent layer of titanium-based BMG to improve ductility of the protective titanium element (step 58). The formation of crystalline phases is induced by the application of ultrasonic vibrations to the aluminum component during material deposition. Ultrasonic vibrations can be provided by an ultrasonic transducer positioned below the deposition platform. A controller can be used to automatically turn the ultrasonic transducer on and off according to a model of the component microstructure. Grain structure of the protective titanium element can be optimized through modeling and can be controlled by applying and removing ultrasonic vibration during the deposition process and selecting processing parameters. Ultrasonic vibrations can be applied continuously to promote crystalline grain structure throughout a layer or can be applied intermittently to promote a hybrid microstructure having both crystalline and amorphous microstructure.

An additional amorphous titanium-based BMG layer is deposited on the outermost portion of the titanium sheath to limit degradation and hot corrosion (step 60). The outer titanium-based BMG layer can be formed in a manner consistent with the formation of inner titanium-based BMG layer, as discussed above.

Deep rolling can be applied following deposition of any material layer, including the final amorphous titanium-based BMG layer formed in step 60, to improve the mechanical properties of the protective titanium sheath (step 62). Deep rolling induces compressive stress to the component, which can further improve ductility and fracture properties. Deep rolling can be applied to each deposited layer of the titanium-based BMG or can be applied to select layers as needed to obtain the desired material properties for a particular application. In a non-limiting embodiment, ultrasonic deep rolling at a frequency not exceeding 50 kHz promoted a desired ductility of at least 10% elongation.

Using the disclosed modified pulsed laser DED method, a titanium alloy can be directly deposited onto an aluminum substrate forming a protective sheath having low galvanic interaction with the underlying aluminum substrate and high strength. The disclosed process produces a titanium-based bulk metallic glass (BMG), which has an amorphous microstructure and which has been shown to result in a 3-5 order of magnitude reduction in electrical conductivity over current titanium sheaths. The BMG can provide strength and protection to the component while reducing or eliminating the need for an insulating layer. Crystalline phases introduced into layers of the BMG using ultrasonic vibration during deposition and deep rolling increase ductility of the protective titanium element.

DISCUSSION OF POSSIBLE EMBODIMENTS

The following are non-exclusive descriptions of possible embodiments of the present invention.

A method of providing a protective titanium layer to an outer surface of an aluminum component includes providing an aluminum component and forming a first layer of titanium-based bulk metallic glass on the component, wherein formation of the bulk metallic glass layer comprises depositing a titanium alloy powder using pulsed directed energy deposition.

The method of the preceding paragraph can optionally include, additionally and/or alternatively, any one or more of the following features, configurations and/or steps:

A further embodiment of the foregoing method can include applying vibrational energy to the component during deposition of a second layer of the titanium alloy powder to introduce crystalline phases into the second layer.

A further embodiment of any of the foregoing methods, wherein vibrational energy can be applied by an ultrasonic transducer.

A further embodiment of any of the foregoing methods, wherein vibrational energy can be applied intermittently to form both crystalline phases and amorphous phases in the second layer.

A further embodiment of any of the foregoing methods can further include depositing a magnesium-containing powder using directed energy deposition to form an insulating layer between the component and the first layer of titanium-based bulk metallic glass.

A further embodiment of any of the foregoing methods, wherein forming the first layer of titanium-based bulk metallic glass can include simultaneously depositing a magnesium-containing powder using pulsed directed energy deposition.

A further embodiment of any of the foregoing methods, wherein the first layer of titanium-based bulk metallic glass can include a plurality of sub-layers and wherein depositing the magnesium-containing powder comprises depositing an amount of magnesium-containing powder that decreases with successive sub-layers.

A further embodiment of any of the foregoing methods can include forming a third layer of titanium-based bulk metallic glass on the component, wherein the second layer is formed between the first layer and the third layer.

A further embodiment of any of the foregoing methods, wherein the second layer can have a tensile ductility of at least ten percent.

A further embodiment of any of the foregoing methods can further include modeling a target microstructure for each of a plurality of titanium alloy layers and devising a deposition process based on the microstructure model, wherein devising the deposition process comprises determining a schedule for applying vibrational energy.

A further embodiment of any of the foregoing methods, wherein the titanium alloy powder has a melting point not exceeding 250 K greater than a melting point of the aluminum component.

A further embodiment of any of the foregoing methods, wherein the component can be an airfoil and the titanium-based bulk metallic glass layer is formed on a leading edge of the airfoil.

An aluminum component includes an outer surface and a sheath covering at least a portion of the outer surface, wherein the sheath comprises a titanium-based bulk metallic glass layer characterized by a predominantly amorphous microstructure.

The method of the preceding paragraph can optionally include, additionally and/or alternatively, any one or more of the following features, configurations and/or components:

A further embodiment of any of the foregoing aluminum component, wherein the sheath can further include a titanium-based bulk metallic glass layer having both amorphous and crystalline phases.

A further embodiment of any of the foregoing aluminum components, wherein the sheath can further include a titanium alloy layer characterized by a predominantly crystalline microstructure A further embodiment of any of the foregoing aluminum components, wherein the titanium-based bulk metallic glass layer can be located between the outer surface and the titanium alloy layer characterized by a predominantly crystalline microstructure.

A further embodiment of any of the foregoing aluminum components can include a layer comprising magnesium formed between the outer surface and the titanium-based bulk metallic glass layer.

A further embodiment of any of the foregoing aluminum components, wherein the titanium-based bulk metallic glass layer can include a plurality of sub-layers comprising magnesium, wherein each successive sub-layer comprises a reduced amount of magnesium.

A further embodiment of any of the foregoing aluminum components, wherein the component can be an aluminum blade of a gas turbine engine and wherein the sheath covers a leading edge of the blade.

A further embodiment of any of the foregoing aluminum components, wherein the sheath has an electrical conductivity at least three orders of magnitude less than a sheath formed of a non-bulk metallic glass titanium or titanium alloy.

In another aspect, a method of providing a protective titanium layer to an aluminum component includes depositing a titanium alloy powder on an outer surface of the aluminum component, pulsing energy directly to the titanium alloy powder, melting the titanium alloy powder, and forming a first layer of titanium-based bulk metallic glass on the component.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An aluminum component comprising:
   an outer surface; and
   a sheath covering at least a portion of the outer surface, wherein the sheath comprises:
      a first titanium-based bulk metallic glass layer characterized by an amorphous microstructure; and
      a second titanium-based bulk metallic glass layer having a microstructure including both amorphous and crystalline phases, wherein the crystalline phases are present in an amount providing the sheath with a tensile ductility of at least ten percent;
      wherein the first titanium-based bulk metallic glass layer is located between the outer surface and the second titanium-based bulk metallic glass layer.

2. The aluminum component of claim 1, and further comprising a layer comprising magnesium formed between the outer surface and the first titanium-based bulk metallic glass layer.

3. The aluminum component of claim 1, wherein the sheath has an electrical conductivity at least three orders of magnitude less than $5.8 \times 10^5$ Siemens/m.

4. The aluminum component of claim 1, wherein the first titanium-based bulk metallic glass layer is formed from a titanium alloy powder having a melting point not exceeding 250 K greater than a melting point of the aluminum component.

5. The aluminum component of claim 1, wherein the component is an airfoil and the sheath is disposed on a leading edge of the airfoil.

6. The aluminum component of claim 1, further comprising a plurality of second titanium-based bulk metallic glass layers, wherein each second titanium-based bulk metallic glass layer has a thickness of at least 20 microns.

7. An aluminum component comprising:
   an outer surface;
   a sheath covering at least a portion of the outer surface, wherein the sheath comprises a first titanium-based bulk metallic glass layer characterized by an amorphous microstructure; and
   layer comprising magnesium formed between the outer surface and the first titanium-based bulk metallic glass layer.

8. The aluminum component of claim 7, wherein the sheath further comprises a second titanium-based bulk metallic glass layer including both amorphous and crystalline phases, wherein the first titanium-based bulk metallic glass layer is located between the outer surface of the aluminum component and the second titanium-based bulk metallic glass layer.

* * * * *